(12) United States Patent
Galan et al.

(10) Patent No.: US 6,899,981 B1
(45) Date of Patent: May 31, 2005

(54) PHOTOMASK AND METHOD FOR DETECTING VIOLATIONS IN A MASK PATTERN FILE USING A MANUFACTURING RULE

(75) Inventors: Gérald Galan, Boulogne Billancourt (FR); Gérard Auligine, Pourrières (FR)

(73) Assignee: DuPont Photomasks, Inc., Round Rock, TX (US)

( * ) Notice: Subject to any disclaimer, the term of this patent is extended or adjusted under 35 U.S.C. 154(b) by 111 days.

(21) Appl. No.: 10/301,195

(22) Filed: Nov. 21, 2002

Related U.S. Application Data

(60) Provisional application No. 60/332,331, filed on Nov. 21, 2001.

(51) Int. Cl.$^7$ .................................................. G03F 9/00
(52) U.S. Cl. ........................................................ 430/5
(58) Field of Search ................................. 430/5; 716/19, 716/21

(56) References Cited

U.S. PATENT DOCUMENTS

2002/0112222 A1 * 8/2002 Fischer et al. ................ 716/19
2003/0061583 A1 * 3/2003 Malhotra ....................... 716/5

* cited by examiner

Primary Examiner—S. Rosasco
(74) Attorney, Agent, or Firm—Baker Botts L.L.P.

(57) ABSTRACT

A photomask and method for detecting failures in a mask pattern file using a manufacturing rule are disclosed. The method includes calculating a manufacturing rule based on a design parameter associated with a manufacturing process and measuring a dimension of a non-linear feature in a mask pattern file. A rule violation is identified in the mask pattern file if the measured dimension is less than the calculated manufacturing rule.

25 Claims, 2 Drawing Sheets

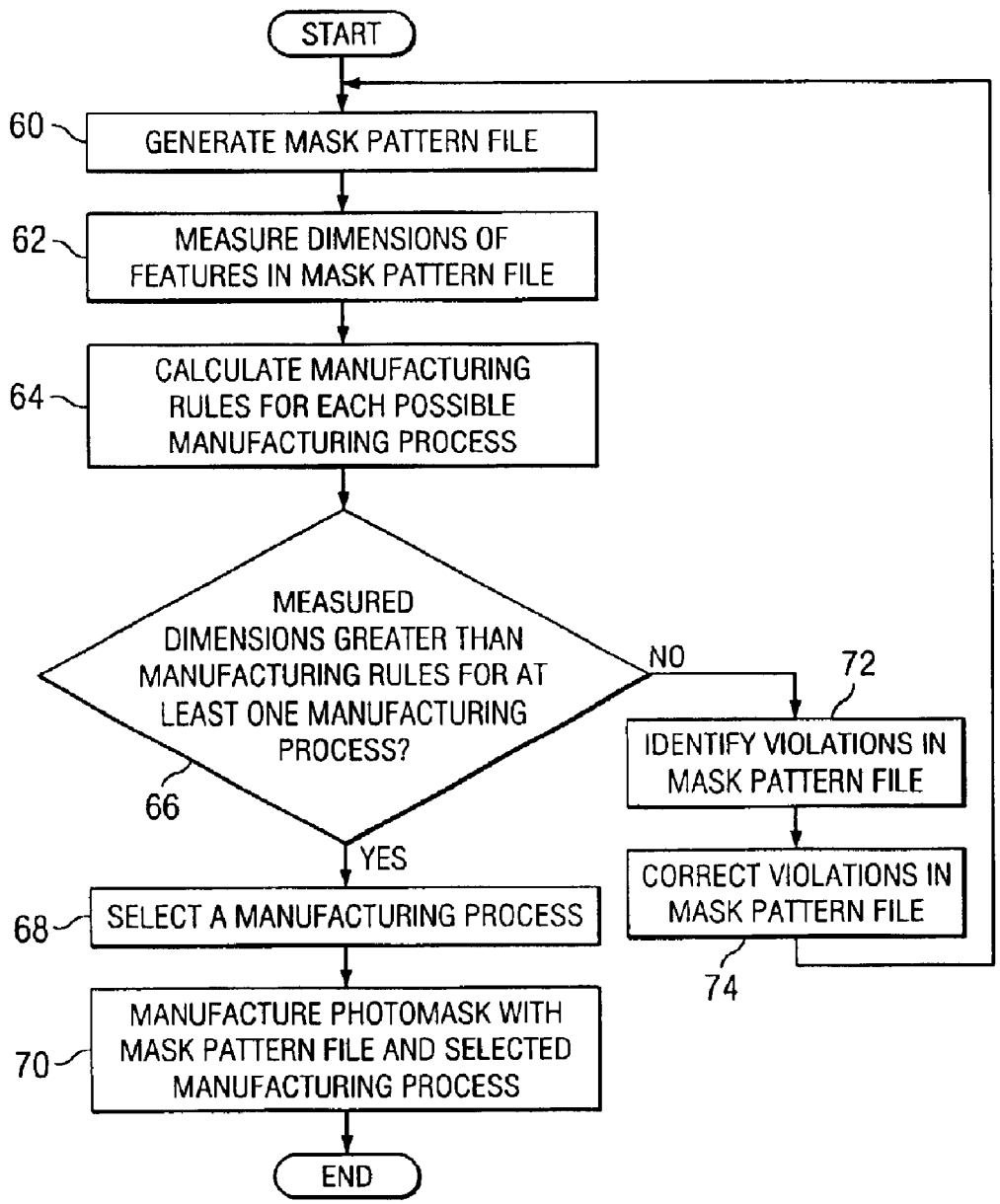

PHOTOMASK AND METHOD FOR DETECTING VIOLATIONS IN A MASK PATTERN FILE USING A MANUFACTURING RULE

CROSS REFERENCE TO RELATED APPLICATION

This application claims priority from U.S. Provisional Patent Application Ser. No. 60/332,331, filed Nov. 21, 2001, and entitled "Method for Predicting Photomask Failures in a Manufacturing Process Based on a Mask Design Rule."

TECHNICAL FIELD

The present invention relates in general to photolithography and, more particularly, to a photomask and method for detecting violations in a mask pattern file using a manufacturing rule.

BACKGROUND OF THE INVENTION

Over the past several years, the performance of microelectronic devices fabricated on semiconductor substrates has rapidly improved. Processing speeds have increased dramatically as device technology nodes have shrunk. For the most part, the dramatic improvements in microelectronic device performance have resulted from the use of the same underlying manufacturing technology. For instance, manufacturing of a microprocessor device on a silicon substrate involves patterning several layers of features in the silicon and depositing metal, such as aluminum or copper, in the features. These different layers of features are created by shining radiant energy on multiple photomasks, also known as masks or reticles.

A photomask typically includes a patterned layer formed on a substrate. The photomask is typically formed by writing data from a mask pattern file into a resist layer of a photomask blank, developing portions of the resist layer, and etching exposed areas of an opaque layer (e.g., chrome) to form the patterned layer. Before the mask pattern file is written on the photomask blank, a rule checking system may evaluate the mask pattern file to determine the smallest feature size in the mask pattern file before a defect is detected.

Depending on the type and complexity of a set of design rules associated with a manufacturing process, the rule checking process may not accurately detect a potential violation in the mask pattern file, especially in light of the expanding number of features found on photomasks. Photomask manufacturers have attempted to reduce the number of false detections by incorporating design rules with the rule checking system. By combining the design rules with the rule checking system, a process is created for analyzing and evaluating the data in the mask pattern file in order assess whether a photomask may be fabricated with a selected manufacturing process.

Conventional design rules typically focus on a minimum width for a linear feature, such as an interconnect between at least two features, on the photomask. When these simple design rules are applied to more complex features (e.g., serifs), false defects may be detected in the mask pattern file during a rule checking process because the conventional design rules may require that the diagonal of the feature be greater than or equal to the minimum line width. Each one of the detected defects are then analyzed by a technician to determine if the flagged feature is a false defect or a rule violation indicating that the feature cannot be formed on the photomask with the selected manufacturing process. This type of manual analysis increases the time and effort needed to manufacture a photomask and may be prone to errors.

SUMMARY OF THE INVENTION

In accordance with teachings of the present invention, the disadvantages and problems associated with detecting violations in a mask pattern file have been substantially reduced or eliminated. In a particular embodiment, a method for detecting violations in a mask pattern file using a manufacturing rule includes identifying a rule violation if a measured dimension of a, feature in a mask pattern file is less than a calculated manufacturing rule.

In accordance with one embodiment of the present invention, a method for detecting violations in a mask pattern file includes calculating a manufacturing rule based on a design parameter associated with a manufacturing process and measuring a dimension of a non-linear feature in a mask pattern file. A rule violation is identified in the mask pattern file if the measured dimension is less than the calculated manufacturing rule.

In accordance with another embodiment of the present invention, a method for determining manufacturability of a photomask includes calculating a manufacturing rule based on a design parameter associated with a manufacturing process and measuring a dimension of a non-linear feature in a mask pattern file. The manufacturing process is selected to fabricate a photomask if the measured dimension is greater than or equal to the calculated manufacturing rule.

In accordance with a further embodiment of the present invention, a photomask includes a patterned layer formed on at least a portion of a substrate. The patterned layer is formed by calculating a manufacturing rule based on a design parameter associated with a manufacturing process and measuring a dimension of a non-linear feature in a mask pattern file. The manufacturing process is selected if the measured dimension is greater than or equal to the calculated manufacturing rule.

Important technical advantages of certain embodiments of the present invention include a mask manufacturing rule that reduces the number of false defects that may be identified in a mask pattern file. The mask manufacturing rule represents a minimum feature size that may be formed on a photomask. The minimum manufacturable feature size is calculated with a design parameter associated with a selected manufacturing process. The mask manufacturing rule, therefore, accurately predicts if the feature may be formed by the selected manufacturing process, which reduces the time required to manufacture the photomask.

Another important technical advantage of certain embodiments of the present invention includes a mask manufacturing rule that allows an optimal manufacturing process to be selected. The manufacturing rule associated with each manufacturing process is automatically calculated and then compared with measured dimensions of features in the mask pattern file. Based on the comparison, an appropriate manufacturing process may be selected even if one or more of the measured dimensions is less than a manufacturing rule for one of the manufacturing processes. By selecting the appropriate manufacturing process, the mask pattern file does not have to be regenerated, which further reduces the time needed to manufacture a photomask.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein:

FIG. 3 illustrates a flow chart of a method for detecting violations in a mask pattern file using a manufacturing rule according to teachings of the present invention.

DETAILED DESCRIPTION OF THE INVENTION

Preferred embodiments of the invention and its advantages are best understood by reference to FIGS. 1 through 4 of the drawings, like numerals being used for like and corresponding parts of the various drawings.

Figure 1:
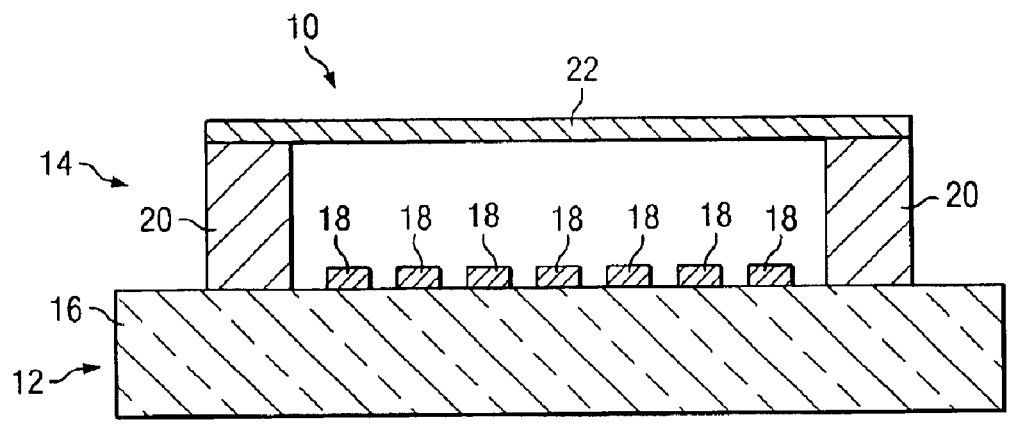
FIG. 1 illustrates a cross-sectional view of a photomask assembly created based on a manufacturing rule according to teachings of the present invention.

FIG. 1 illustrates a cross-sectional view of photomask assembly 10 created based on a manufacturing rule. Photomask assembly 10 includes photomask 12 coupled to pellicle assembly 14. Substrate 16 and patterned layer 18 form photomask 12, otherwise known as a mask or reticle, that may have a variety of sizes and shapes, including but not limited to round, rectangular, or square. Photomask 12 may also be any variety of photomask types, including, but not limited to, a one-time master, a five-inch reticle, a six-inch reticle, a nine-inch reticle or any other appropriately sized reticle that may be used to project an image of a circuit pattern onto a semiconductor wafer. Photomask 12 may further be a binary mask, a phase shift mask (PSM), an optical proximity correction (OPC) mask or any other type of mask suitable for use in a lithography system.

Photomask 12 includes patterned layer 18 formed on substrate 16 that, when exposed to electromagnetic energy in a lithography system, projects a pattern onto a surface of a semiconductor wafer (not expressly shown). Substrate 16 may be a transparent material such as quartz, synthetic quartz, fused silica, magnesium fluoride ($MgF_2$), calcium fluoride ($CaF_2$), or any other suitable material that transmits at least seventy-five percent (75%) of incident light having a wavelength between approximately 10 nanometers (nm) and approximately 450 nm. In an alternative embodiment, substrate 16 may be a reflective material such as silicon or any other suitable material that reflects greater than approximately fifty percent (50%) of incident light having a wavelength between approximately 10 nm and 450 nm.

Patterned layer 18 may be a metal material such as chrome, chromium nitride, a metallic oxy-carbo-nitride (M-O-C-N), where the metal is selected from the group consisting of chromium, cobalt, iron, zinc, molybdenum, niobium, tantalum, titanium, tungsten, aluminum, magnesium and silicon, or any other suitable material that absorbs electromagnetic energy with wavelengths in the ultraviolet (UV) range, deep ultraviolet (DUV) range, vacuum ultraviolet (VUV) range and extreme ultraviolet range (EUV). In an alternative embodiment, patterned layer 18 may be a partially transmissive material, such as molybdenum silicide (MoSi), which has a transmissivity of approximately one percent (1%) to approximately thirty percent (30%) in the UV, DUV, VUV and EUV ranges.

Frame 20 and pellicle film 22 may form pellicle assembly 14. Frame 20 is typically formed of anodized aluminum, although it could alternatively be formed of stainless steel, plastic or other suitable materials that do not degrade or outgas when exposed to electromagnetic energy within a lithography system. Pellicle film 22 may be a thin film membrane formed of a material such as nitrocellulose, cellulose acetate, an amorphous fluoropolymer, such as TEFLON® AF manufactured by E. I. du Pont de Nemours and Company or CYTOP® manufactured by Asahi Glass, or another suitable film that is transparent to wavelengths in the UV, DUV, EUV and/or VUV ranges. Pellicle film 22 may be prepared by a conventional technique such as spin casting.

Pellicle film 22 protects photomask 12 from contaminants, such as dust particles, by ensuring that the contaminants remain a defined distance away from photomask 12. This may be especially important in a lithography system. During a lithography process, photomask assembly 10 is exposed to electromagnetic energy produced by a radiant energy source within the lithography system. The electromagnetic energy may include light of various wavelengths, such as wavelengths approximately between the I-line and G-line of a Mercury arc lamp, or DUV, VUV or EUV light. In operation, pellicle film 22 is designed to allow a large percentage of the electromagnetic energy to pass through it. Contaminants collected on pellicle film 22 will likely be out of focus at the surface of the wafer being processed and, therefore, the exposed image on the wafer should be clear. Pellicle film 22 formed in accordance with the teachings of the present invention may be satisfactorily used with all types of electromagnetic energy and is not limited to lightwaves as described in this application.

Photomask 12 may be formed from a photomask blank using a standard lithography process. In a lithography process, a mask pattern file that includes data for patterned layer 18 may be generated from a mask layout file. The mask layout file may include polygons that represent transistors and electrical connections for an integrated circuit. The polygons in the mask layout file may further represent different layers of the integrated circuit when it is fabricated on a semiconductor wafer. For example, a transistor may be formed on a semiconductor wafer with a diffusion layer and a polysilicon layer. The mask layout file, therefore, may include one or more polygons drawn on the diffusion layer and one or more polygons drawn on the polysilicon layer. The polygons for each layer may be converted into a mask pattern file that represents one layer of the integrated circuit. Each mask pattern file may be used to generate a photomask for the specific layer.

Once the mask pattern file has been generated, a mask rule checking (MRC) system may be used to measure dimensions of various critical features in the mask pattern file. The MRC system may compare the measured dimensions to one or more manufacturing rules associated with a specific manufacturing process (e.g., an etching process, a writing process or a combination thereof). In one embodiment, the inspection system may be software, such as CATS™ (computer aided transcription system) MRC (mask rule checking) developed and sold by Numerical Technologies, Inc., that may read the mask pattern file, measure specific features in the mask pattern file and compare the measure features to the manufacturing rules. In some embodiments, the software for detecting violations in a mask pattern file may be encoded in computer-usable media. Such computer-usable media may include, without limitation, storage media such as floppy disks, hard disks, CD-ROMs, DVDs, read-only memory, and random access memory; as well as communications media such wires, optical fibers, microwaves, radio waves, and other electromagnetic or optical carriers.

The manufacturing rules may be calculated based on a design parameter associated with the selected manufacturing process. In one embodiment, the manufacturing rules may include a surface area of a feature. In another embodiment, the manufacturing rules may include a distance between at least two vertices of a feature. The calculated manufacturing rules may be more accurate than only using a minimum line width for a MRC process because the manufacturability of a feature does not solely depend on a minimum width. Instead, whether features having smaller dimensions than the minimum width may be formed on the photomask depends on a combination of the manufacturing tool used to form the features from the mask pattern file in a resist layer of a photomask blank, the etch process used to remove the material in patterned layer 18 and the sizing of the features.

If the MRC system determines that the mask pattern file includes feature dimensions that are less than the manufacturing rules for the selected manufacturing process, rule violations may be identified in the mask pattern file. In one embodiment, the violations may be graphically represented on a display screen associated with the MRC system. The violations may then be corrected so that the mask pattern file may be used within the selected manufacturing process. The measured dimensions in the mask pattern file may also be compared with the manufacturing rules associated with other manufacturing processes. If the measured dimensions are greater than or equal to at least one of the manufacturing rules for the other manufacturing processes, the mask pattern file may be used to manufacture a photomask.

Once the mask pattern file has been checked to verify that it may be used with the selected manufacturing process, the desired pattern may be imaged into a resist layer of the photomask blank using a laser, electron beam or X-ray lithography system. In one embodiment, a laser lithography system uses an Argon-Ion laser that emits light having a wavelength of approximately 364 nanometers (nm). In alternative embodiments, the laser lithography system uses lasers emitting light at wavelengths from approximately 150 nm to approximately 300 nm. Photomask 12 may be fabricated by developing and etching exposed areas of the resist layer to create a pattern, etching the portions of patterned layer 18 not covered by resist, and removing the undeveloped resist to create patterned layer 18 over substrate 16.

Figure 2:
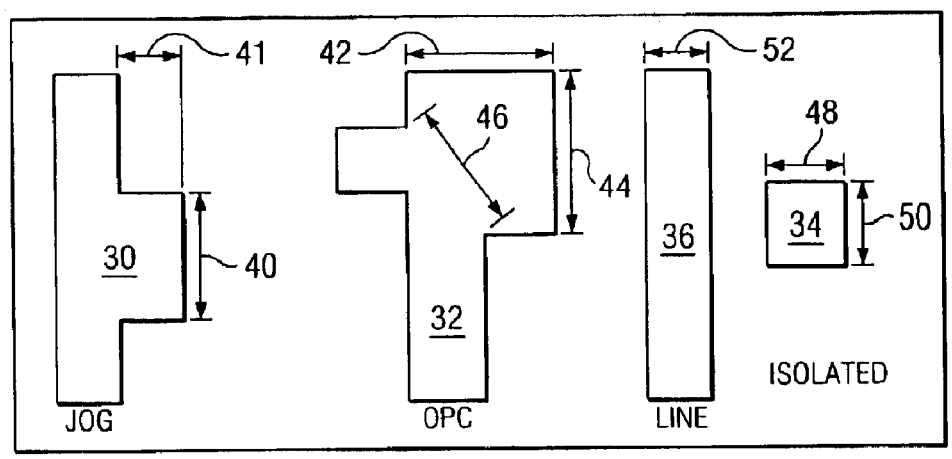
FIG. 2 illustrates geometric features in a mask pattern file according to teachings of the present invention.

FIG. 2 illustrates geometric features in a mask pattern file that may be included in patterned layer 18 on photomask 12. Several features may be combined to form the pattern that represents a microelectronic image in patterned layer 18. In one embodiment, patterned layer 18 may include non-linear features, such as jog feature 30, optical proximity correction (OPC) feature 32 and/or isolated feature 34, and linear features, such as line feature 36. Jog feature 30 may include a protruding portion that has a critical dimension indicated by jog edge 40. OPC feature 32 may be a serif formed on the corner of a pattern (e.g., line feature 36) to eliminate corner rounding when the patterns on photomask 12 are imaged into a resist layer of a wafer. Critical dimensions of OPC feature 32 include OPC edges 42 and 44 and OPC diagonal 46. In one embodiment, OPC edges 42 and 44 may be approximately equal. In another embodiment, OPC edge 42 may be greater or less than OPC edge 44. Isolated feature 34 may be a small feature in an isolated area and may include critical dimensions indicated by isolated edges 48 and 50. Line feature 36 may be used as an interconnect between one or more features and may include a critical dimension indicated by line width 52.

During a MRC process, a MRC system may measure the critical dimensions of jog feature 30, OPC feature 32, isolated feature 34, line feature 36 and compare the measured dimensions with manufacturing rules for a number of different manufacturing processes. The manufacturing rules for the various manufacturing processes may include a design parameter (b), a minimum surface area calculated with the following formula:

$$area = b^2 * 1.20.$$

and a minimum distance between at least two vertices (c) calculated with the following formula:

$$c = \sqrt{b}/2.$$

For each manufacturing process, the measured dimension for jog edge 40 may be compared to the design parameter (b), the measured value for OPC diagonal 46 may be compared to the calculated minimum distance between at least two vertices (c), the measured value for the area of isolated feature 34 (e.g., obtained by measuring isolated edges 48 and 50 and multiplying the measured values) may be compared to the calculated minimum area (area) and the measured value for line width (52) may be compared to the design parameter (b). If the measured dimensions are greater than or equal to the calculated manufacturing rules, the mask pattern file may be used in the manufacturing process. If, however, the measured dimensions are less than the manufacturing rules for any given manufacturing process, rule violations may be identified in the mask pattern file and the mask pattern file may not be used to create photomask 12 with the corresponding manufacturing process.

In one embodiment, jog edge 41 may be less than the minimum resolution of an inspection system (e.g., approximately one half of the pixel size of the inspection system) such that the inspection system will not identify a defect on photomask 12. For example, jog edges 40 and 41 may represent an OPC feature that is used to improve the edge of jog feature 30 on a semiconductor wafer. If jog edge 41 is greater than or equal to the minimum resolution of the inspection system, the inspection system may detect a false defect when the size of the feature in patterned layer 18 is compared to the size of jog feature 30 in the mask pattern file. However, if jog edge 41 is less than the resolution capability of the inspection system, the inspection system will not detect a defect and jog feature 30 may be used to improve a lithography process that uses photomask 12 to project an image on a semiconductor wafer.

FIG. 3 illustrates a flow chart of a method for detecting violations in a mask pattern file using a manufacturing rule. Generally, a MRC system measures dimensions of critical features in a mask pattern file and calculates manufacturing rules for each possible manufacturing process that may be used to form features from the mask pattern file on a photomask. The MRC system then compares the measured dimensions with the calculated rules to determine if the manufacturing processes may be used to fabricate a photomask from the mask pattern file. If the measured dimensions are greater than or equal to the calculated manufacturing rules for at least one of the manufacturing processes, the mask pattern file may be used to fabricate the photomask. If the measured dimensions are less than all of the calculated manufacturing rules, the mask pattern file may be removed from the manufacturing process until rule violations associated with at least one of the manufacturing rules are eliminated.

At step 60, a mask pattern file is generated from a mask layout file created by an integrated circuit designer. The mask layout file may include polygons that represent transistors and electrical connections for the different layers of an integrated circuit. The mask layout file may include data formatted in the GDS-II™ format, CIF™ format, DFII™ format, DXF™ format, the Applicon™ format or any other suitable format that describes the geometry and interconnections of integrated circuits. In one embodiment, the mask layout file is converted or fractured into a mask pattern file containing rectangles and trapezoids for use in an electron beam writing system. In another embodiment, the mask layout file is fractured into a mask pattern file containing rectangles and rotated rectangles for use in a laser writing system.

Once the mask pattern file is created, a MRC system may measure various dimensions of critical features in the mask pattern file at step 62. For example, referring to FIG. 2, the MRC system may measure jog edge 40 to determine the critical dimension for jog feature 30, line width 52 to determine the distance between parallel edges for line feature 36, the smaller of OPC edges 42 and 44 to determine a critical dimension for OPC feature 32, OPC diagonal 46 to determine a critical distance between at least two vertices of OPC feature 32, the smaller of isolated edges 48 and 50 to determine the critical dimension for isolated feature 34 and both of isolated edges 48 and 50 to determine the critical area. These measured dimensions may represent the critical dimensions for each type of feature, both linear and non-linear, present in the mask pattern file.

At step 64, the MRC system calculates manufacturing rules for each possible manufacturing process that may be used to fabricate a photomask from the mask pattern file. This step may be performed before, after or simultaneously with step 62. In one embodiment, the manufacturing process may be a writing process performed by a laser writing system or an electron beam writing system. In another embodiment, the manufacturing process may be an etching process (e.g., a wet etch or a dry etch). In a further embodiment, the manufacturing process may be a combination of the writing process and the etching process. Each manufacturing process may include one or more manufacturing rules calculated based on a design parameter (e.g., the smallest distance between two edges that may be formed in patterned layer 18 on photomask 12 with the selected manufacturing process). Table 1 includes example manufacturing processes and example design parameters for each manufacturing process.

TABLE 1

| Writing Tool | Resist Type | Etch Process | Design Parameter |
|---|---|---|---|
| Alta 3000 | 895I | Wet etch | b = 600 nm |
| Alta 3700 | IP3600 | Wet etch | b = 800 nm |
| Mebes 4500 | PBS | Wet etch | b = 400 nm |
| Mebes 4500 | ZEP | Wet etch | b = 500 nm |
| Mebes 4500 | ZEP | Dry etch | b = 400 nm |

In other embodiments, the design parameter for the various manufacturing processes may be between approximately 10 nm to approximately 1000 nm.

Since the minimum line width (e.g., line width 52 of line feature 36 illustrated in FIG. 2) may not accurately represent the capabilities of a specific writing system and/or etch process, the manufacturing rules may include minimum values for other dimensions in the mask pattern file. For example, in addition to the minimum line width, the manufacturing rules may include a design parameter that represents a critical dimension for a non-linear feature, such as jog edge 40, the smaller of OPC edges 42 and 44 and/or the smaller of isolated edges 48 and 50. In some embodiments, the manufacturing rules may include a minimum distance between at least two vertices (c) of a feature (e.g., OPC diagonal 46 as illustrated in FIG. 2), which may be smaller than the design parameter (b) for a manufacturing process. This minimum vertice distance may be calculated with the following formula:

$$c = \sqrt{b}/2,$$

where b is the design parameter associated with the manufacturing process. In other embodiments, the manufacturing rules may further include a minimum area for an isolated feature (e.g., isolated feature 36 as illustrated in FIG. 2) calculated with the following formula:

$$\text{area} = b^2 * 1.2,$$

where b is the design parameter associated with the manufacturing process. Using the above formulas, the calculated manufacturing rules for each manufacturing process shown in Table 1 are listed in Table 2.

TABLE 2

| Manufacturing Process | Design parameter | Minimum Area = $b^2 * 1.2$ | Min. Vert. Dist. = $\sqrt{b}/2$ |
|---|---|---|---|
| Alta 3000 895I Wet etch | b = 600 nm | 0.432 $\mu m^2$ | 0.012 $\mu m$ |
| Alta 3700 IP3600 Wet etch | b = 800 nm | 0.768 $\mu m^2$ | 0.014 $\mu m$ |
| Mebes 4500 PBS Wet etch | b = 400 nm | 0.192 $\mu m^2$ | 0.010 $\mu m$ |
| Mebes 4500 ZEP Wet etch | b = 500 nm | 0.300 $\mu m^2$ | 0.011 $\mu m$ |
| Mebes 4500 ZEP Dry Etch | b = 400 nm | 0.192 $\mu m^2$ | 0.010 $\mu m$ |

In one embodiment, each calculated manufacturing rule may be stored in a database such that the one or more manufacturing rules are associated with the appropriate manufacturing process.

At step 66, the measured dimensions from the mask pattern file are compared to the respective manufacturing rules for the possible manufacturing processes. For example, the measured value for jog edge 40 and line width 52 may be compared with the design parameter, the measured value for OPC diagonal 46 may be compared with the minimum vertice distance and the measured value for the area of isolated feature 34 may be compare with the calculated minimum area. If the measured dimensions are greater than or equal to the manufacturing rules for at least one of the manufacturing processes, a manufacturing process may be selected at step 68. For example, the manufacturing processes listed in Table 1 may be used to generate a photomask. The MRC system may measure one or more of the dimensions for the critical features (e.g., jog edge 40, OPC edges 42 and 44, OPC diagonal 46, isolated edges 48 and 50 and line width 52) to determine the measured dimensions of the various features in the mask pattern file. In one example, a measured critical dimension of one of the non-linear features may be approximately 0.48 micrometers ($\mu m$), the measured line width (e.g., line edge 52 for line feature 36) may be approximately 0.6 $\mu m$ and the area of isolated feature 34 (e.g., determined by multiplying isolated edge 48 by isolated edge 50) may be approximately 0.208 $\mu m$.

In one embodiment, the measured dimension may be biased by a sizing value. For example, the sizing value may be in the range of approximately 80 nm to approximately 200 nm. For a dark feature (e.g., a feature representing an area of photomask 12 covered with the material used for patterned layer 18), the sizing value may be added to the measured dimension and for a clear feature (e.g., a feature representing an area of photomask 12 in which substrate 16 is exposed), the sizing value may be subtracted from the measured dimension. If the features measured above are clear features and the sizing value is approximately 80 nm, the biased critical dimension may be approximately 0.4 μm and the biased line width may be approximately 0.52 μm.

These measured values are then compared to the manufacturing rules shown in Table 2 for the various manufacturing processes to determine which manufacturing processes may be acceptable to manufacture photomask 12 with the specific mask pattern file. Once the manufacturing process is selected, the mask pattern file is used in the appropriate manufacturing process (e.g., writing tool and etch process) to fabricate photomask 12 at step 70.

If the measured dimensions from the mask pattern file are less than all of the manufacturing rules for the possible manufacturing processes, the mask pattern file may not be used with any of the possible manufacturing processes and rule violations associated with the critical features are identified in the mask pattern file at step 72. In one embodiment, the features in the mask pattern file may be graphically displayed on a display screen and a rule violation may be indicated by a cross, circle, square or any other appropriate shape that may graphically represent the rule violation. At step 74, the identified violations may be fixed in the mask pattern file by notifying the integrated circuit designer that generated the mask layout file and having the designer make any necessary changes. The redesigned mask layout file may then be used to regenerate the mask pattern file at step 60.

Although the present invention has been described with respect to a specific preferred embodiment thereof, various changes and modifications may be suggested to one skilled in the art and it is intended that the present invention encompass such changes and modifications fall within the scope of the appended claims.

What is claimed is:

1. A method for detecting rule violations in a mask pattern file, comprising:
   calculating a manufacturing rule based on a design parameter associated with a manufacturing process;
   measuring a non-edge dimension of a feature in a mask pattern file, the non-edge dimension comprising a dimension of the feature other than the length of an edge of the feature; and
   identifying a rule violation in the mask pattern file if the measured non-edge dimension is less than the calculated manufacturing rule.

2. The method of claim 1, further comprising the calculated manufacturing rule including a minimum area (area) calculated based on the design parameter (b) using the formula:

$$area = b^2 * 1.20.$$

3. The method of claim 1, further comprising the calculated manufacturing rule including a minimum vertice distance (c) calculated based on the design parameter (b) using the formula:

$$c = \sqrt{b}/2.$$

4. The method of claim 1, wherein the feature comprises a jog feature, an optical proximity correction (OPC) feature or an isolated feature.

5. The method of claim 4, wherein measuring the non-edge dimension of the feature in the mask pattern file comprises determining a measured area for the isolated feature.

6. The method of claim 4, wherein measuring the non-edge dimension of the feature in the mask pattern file comprises determining a measured vertice distance for the OPC feature.

7. The method of claim 4, wherein measuring the non-edge dimension of the feature in the mask pattern file comprises determining a measured distance between at least two edges of the jog feature.

8. The method of claim 1, wherein the design parameter comprises a range between approximately ten nanometers and approximately one thousand nanometers.

9. The method of claim 1, further comprising the manufacturing process including an etching process.

10. The method of claim 9, wherein the etching process comprises a dry etch.

11. The method of claim 9, wherein the etching process comprises a wet etch.

12. The method of claim 1, further comprising selecting the manufacturing process to fabricate a photomask using the mask pattern file if the measured non-edge dimension is greater than or equal to the calculated manufacturing rule.

13. The method of claim 1, further comprising:
   measuring a width of a linear feature in the mask pattern file; and
   identifying the rule violation in the mask pattern file if the measured width is less than the calculated manufacturing rule.

14. A method for determining manufacturability of a photomask based on manufacturing rules, comprising:
   calculating a manufacturing rule based on a design parameter associated with a manufacturing process;
   measuring a non-edge dimension of a feature in a mask pattern file, the non-edge dimension comprising a dimension of the feature other than the length of an edge of the feature; and
   selecting the manufacturing process to fabricate a photomask if the measured non-edge dimension is greater than or equal to the calculated manufacturing rule.

15. The method of claim 14, further comprising the calculated manufacturing rule including a minimum area (area) calculated based on the design parameter (b) using the formula:

$$area = b^2 * 1.20.$$

16. The method of claim 14, further comprising the calculated manufacturing rule including a minimum vertice distance (c) calculated based on the design parameter (b) using the formula:

$$c = \sqrt{b}/2.$$

17. The method of claim 14, further comprising the measured non-edge dimension adjusted by a sizing value.

18. The method of claim 14, wherein the manufacturing process comprises a writing process.

19. The photomask of claim 18, further comprising the manufacturing process including an etching process.

20. A photomask, comprising:
   a substrate; and
   a patterned layer formed on at least a portion of the substrate, the patterned layer formed by:
   calculating a manufacturing rule based on a design parameter associated with a manufacturing process;
   measuring a non-edge dimension of a feature in a mask pattern file, the non-edge dimension comprising a dimension of the feature other than the length of an edge of the feature; and selecting the manufacturing process to fabricate the photomask if the measured non-edge dimension is greater than or equal to the calculated manufacturing rule.

21. The photomask of claim 20, further comprising the calculated manufacturing rule including a minimum area (area) calculated based on the design parameter (b) using the formula:

$$area = b^2 * 1.20.$$

22. The photomask of claim 20, further comprising the calculated manufacturing rule including a minimum vertice distance (c) calculated based on the design parameter (b) using the formula $$c = \sqrt{b}/2.$$

23. A photomask assembly, comprising:
a pellicle assembly defined in part by a pellicle frame and a pellicle film attached thereto; and
a photomask coupled to the pellicle assembly opposite from the pellicle film, the photomask including a patterned layer formed on a substrate, the patterned layer formed by:

calculating a manufacturing rule based on a design parameter associated with a manufacturing process;

measuring a non-edge dimension of a feature in a mask pattern file, the non-edge dimension comprising a dimension of the feature other than the length of an edge of the feature; and selecting the manufacturing process to fabricate the photomask if the measured non-edge dimension is greater than or equal to the calculated manufacturing rule.

24. The photomask assembly of claim 23, further comprising the calculated manufacturing rule including a minimum area (area) calculated based on the design parameter (b) using the formula:

$$area = b^2 * 1.20.$$

25. The photomask assembly of claim 23, further comprising the calculated manufacturing rule including a minimum vertice distance (c) calculated based on the design parameter (b) using the formula:

$$c = \sqrt{b}/2.$$

* * * * *